United States Patent
Tashima

(10) Patent No.: US 9,915,705 B2
(45) Date of Patent: Mar. 13, 2018

(54) BATTERY CONTROL DEVICE AND BATTERY CHARGE CAPACITY DIAGNOSIS METHOD

(71) Applicant: FUJITSU LIMITED, Kawasaki-shi, Kanagawa (JP)

(72) Inventor: Hiroki Tashima, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 292 days.

(21) Appl. No.: 14/457,632

(22) Filed: Aug. 12, 2014

(65) Prior Publication Data

US 2015/0067379 A1    Mar. 5, 2015

(30) Foreign Application Priority Data

Sep. 5, 2013 (JP) ................. 2013-184344

(51) Int. Cl.
*G06F 11/30* (2006.01)
*G01R 31/36* (2006.01)

(52) U.S. Cl.
CPC ...... *G01R 31/3679* (2013.01); *G01R 31/3675* (2013.01); *G06F 11/3062* (2013.01)

(58) Field of Classification Search
CPC ............ G01R 31/3675; G01R 31/3679; H04N 1/00899; G06F 1/263; G06F 1/28; G06F 11/3058
See application file for complete search history.

(56) References Cited

U.S. PATENT DOCUMENTS

| | | | | |
|---|---|---|---|---|
| 2002/0193954 A1* | 12/2002 | Yamanaka | ......... | G01R 31/3651 702/63 |
| 2004/0232885 A1* | 11/2004 | Sakai | ...................... | H02J 9/061 320/132 |
| 2005/0024905 A1* | 2/2005 | Shiojima | ................. | H02J 9/061 363/110 |
| 2005/0132150 A1* | 6/2005 | Jewell | ................... | G06F 3/0619 711/154 |
| 2006/0113959 A1* | 6/2006 | Honma | .............. | G01R 31/3662 320/128 |

(Continued)

FOREIGN PATENT DOCUMENTS

| | | |
|---|---|---|
| JP | 5-74501 | 3/1993 |
| JP | 7-160433 | 6/1995 |

(Continued)

OTHER PUBLICATIONS

Office Action issued by the Japanese Patent Office dated Feb. 28, 2017 in corresponding Japanese patent application No. 2013-184344.

*Primary Examiner* — Kim Huynh
*Assistant Examiner* — Brandon Kinsey
(74) *Attorney, Agent, or Firm* — Staas & Halsey LLP

(57) ABSTRACT

A battery control device includes: a battery; a storage circuitry configured to store a disconnection time which indicates a time at which a power supply is disconnected; and a diagnosis circuitry configured to, when the power supply is reactivated, diagnose a charge capacity of the battery at the time of reactivation based on a disconnection period obtained from the disconnection time and a time at when the power supply is reactivated, a temperature of the battery in a state during the power supply is disconnected and a deterioration degree of the battery.

4 Claims, 7 Drawing Sheets

(56) References Cited

U.S. PATENT DOCUMENTS

| | | | | |
|---|---|---|---|---|
| 2008/0084185 A1* | 4/2008 | Nakazawa | ............ | H02J 9/061 |
| | | | | 320/128 |
| 2011/0225345 A1* | 9/2011 | Inoue | ................. | G06F 3/0619 |
| | | | | 711/103 |
| 2011/0314319 A1* | 12/2011 | Kurahashi | ............ | H02J 7/0073 |
| | | | | 713/340 |

FOREIGN PATENT DOCUMENTS

| JP | 2001-56362 | 2/2001 |
|---|---|---|
| JP | 2008-145349 | 6/2008 |
| JP | 2009-139184 | 6/2009 |

\* cited by examiner

BATTERY CONTROL DEVICE AND BATTERY CHARGE CAPACITY DIAGNOSIS METHOD

CROSS-REFERENCE TO RELATED APPLICATION

This application is based upon and claims the benefit of priority of the prior Japanese Patent Application No. 2013-184344 filed on Sep. 5, 2013, the entire contents of which are incorporated herein by reference.

FIELD

The embodiments discussed herein are related to a battery control device.

BACKGROUND

In a RAID (Redundant Array of Inexpensive Disks) device, when power failure of an external power supply has occurred, data is transferred from a cache memory to be written to a disk drive using a battery power supply for backup in order to prevent data on the cache memory from being lost.

However, when a charge capacity of a battery power supply is insufficient at the time of the power failure, the RAID device fails to backup the data on the cache memory causing data loss. In order to prevent the data loss, a RAID controller which controls the RAID device always monitors the charge capacity of the battery power supply via a monitoring equipment to determine whether the charge capacity required for rewriting all of data on the cache memory is secured.

When the charge capacity of the battery power supply is greater than or equal to the capacity required for the cache memory backup, the RAID device operates in a write back mode. The write back mode is an operation mode in which the RAID device informs a host of the completion of a write command at the time when the write command is received from the host. In the meantime, when the charge capacity of the battery power supply is less than the capacity required for the cache memory backup, the RAID device operates in a write through mode. The write through mode is an operation mode in which even when the RAID device has received the command from the host, the RAID device does not inform the host of the completion of the write command until the data of the cache memory is transferred to be written into the disk drive. Therefore, when the RAID device operates in the write through mode, the performance of completion response of the write command to the host is remarkably reduced.

When the battery power supply is discharged due to a certain cause and the capacity of the battery power supply becomes less than the capacity required for the backup, the RAID device shifts to the write through mode and thus, reduction of the performance occurs. Thereafter, when the battery power supply is recharged and the capacity required for the backup is charged, the RAID device returns to the write back mode. Accordingly, when the capacity of battery power supply may be accurately assessed, the performance of the RAID device may be enhanced.

The causes of discharge of the battery power supply may include a case where the backup is performed due to power failure and a case where self-discharge occurs during stopping of charge of the battery by, for example, disconnection of a power supply of the RAID device. In the case where the backup is performed due to the power failure, since the monitoring equipment may monitor a discharge power and discharge time period of the battery power supply, a discharge capacity may be easily specified and the RAID device may assess the charge capacity after discharge. In the meantime, in the case of the self-discharge, since the monitoring equipment is also stopped during the disconnection of the power supply, the RAID device is not able to assess the charge capacity after the self-discharge.

Therefore, a method has been known in which, for example, an initial value of charging ratio obtained from a battery voltage at the time of system startup and an initial value of charging ratio that was stored at the time when the previous activation is ended are selected based on a battery stop time to assess the charge capacity at the time of the system startup.

However, the accuracy of charge capacity diagnosis at the time of reactivation is not sufficient, which is problematic. For example, even when the values of the battery voltage at the time of the system startup are the same, actual charge capacities may be different from each other due to, for example, a battery charge state before the disconnection of the power supply or a state (e.g., a time period and temperature) at the time of the disconnection of the power supply. In the charge capacity diagnosis at the time of the reactivation, the charge capacity is calculated for a case where the strictest condition is applied to the battery voltage at the time of the system startup. This is because the RAID device intends to avoid the data loss from occurring due to the failure of data backup during the power failure. Accordingly, a disparity occurs between the charge capacity calculated by the charge capacity diagnosis at the time of the reactivation and the actual charge capacity. That is, the accuracy of diagnosis becomes deteriorated in the diagnosis of charge capacity at the time of the reactivation.

Such a problem will be described with reference to FIG. 7. FIG. 7 is a view explaining about a charge capacity at the time of the reactivation. Here, it is assumed that the battery power supply was charged with 100% of charge capacity at the time when the power supply is disconnected. As illustrated in FIG. 7, the battery power supply is discharged by the disconnection of the power supply. In the meantime, even when the actual charge capacity was 60% (C2) at the time when the power was supplied and the battery power supply was reactivated, since the strictest condition is applied to the battery voltage at the time of the system startup, the charge capacity is calculated as 20% (C1) in the charge capacity diagnosis. As a result, a time period spanning from the time of reactivation to a time at which the calculated charge capacity reaches the charge capacity of C2 by the charge capacity diagnosis performed continuously is required. When the charge capacity C2 is set as a boundary at which the write back mode is possible, the RAID device is allowed to be operated at the write through mode, thereby causing degradation in performance.

Further, the problem occurs in the RAID device as well as the entire battery power supply.

The following are reference documents.
[Document 1] Japanese Laid-Open Patent Publication No. 2008-145349,
[Document 2] Japanese Laid-Open Patent Publication No. 2009-139184,

[Document 3] Japanese Laid-Open Patent Publication No. 2001-56362 and
[Document 4] Japanese Laid-Open Patent Publication No. 07-160433.

SUMMARY

According to an aspect of the invention, a battery control device includes: a battery; a storage circuitry configured to store a disconnection time which indicates a time at which a power supply is disconnected; and a diagnosis circuitry configured to, when the power supply is reactivated, diagnose a charge capacity of the battery at the time of reactivation based on a disconnection period obtained from the disconnection time and a time at which the power supply is reactivated, a temperature of the battery in a state during which the power supply is disconnected and a deterioration degree of the battery The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments of a battery control device, a battery charge capacity diagnosis method and a battery charge capacity diagnosis program disclosed in the present disclosure will be described with reference to accompanying drawings in detail. It is assumed that the present embodiment is applied to a RAID device provided with a battery control device. Further, the present disclosure is not limited to the present embodiment.

Embodiment 1

[Hardware Configuration of RAID Device According to Embodiment 1]

Figure 1:
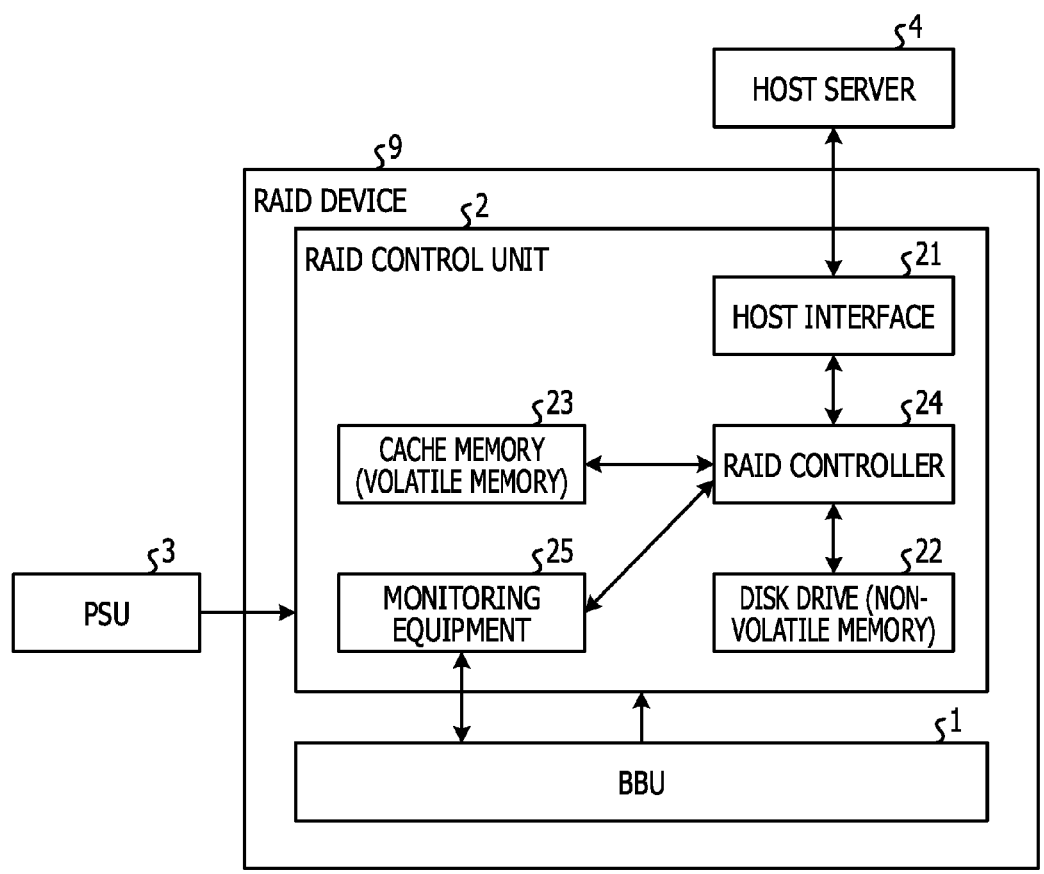
FIG. 1 is a view illustrating a hardware configuration of a RAID device according to Embodiment 1.

FIG. 1 is a view illustrating a hardware configuration of a RAID device according to Embodiment 1. As illustrated in FIG. 1, a RAID device 9 is connected with a PSU (Power Supply Unit) 3 and a host server 4. The PSU 3 is a power supply device which supplies power to the RAID device 9 from outside. The host server 4 issues a write command to the RAID device 9 causing data to be transferred to be written into. Further, the host server 4 issues a read command to the RAID device 9, which causes data to be read from. Also, the host server 4 receives a response to the issuance of the write command or the read command from the RAID device 9. Further, hereinafter, a case where the write command is issued from the host server 4 will be described.

Further, the RAID device 9 includes a BBU (Battery Backup Unit) 1 and a RAID control unit 2.

The BBU 1 is a secondary battery that supplies a RAID control unit 2 with power charged previously for a case where power is not supplied from the PSU 3 to the RAID control unit 2. The case where power is not supplied from the PSU 3 to the RAID control unit 2 may include, for example, a case of a power supply disconnection or a power failure. Hereinafter, the case where power is not supplied from the PSU 3 to the RAID control unit 2 will be described as a case of the power supply disconnection. Further, a detailed configuration of the BBU 3 will be described later.

The RAID control unit 2 controls the RAID device 9. The RAID control unit 2 includes a host interface 21, a disk drive 22, a cache memory 23, a RAID controller 24 and a monitoring equipment 25.

The host interface 21 is an interface between the host server 4 and the RAID device 9.

The disk drive 22 is a non-volatile memory such as, for example, a HDD (Hard Disk Drive) and a SSD (Solid State Drive). The disk drive 22 stores data.

The cache memory 23 is a volatile memory such as, for example, a DIMM (Dual Inline Memory Module) and a DDR SDRAM (Double Date Rate Synchronous DRAM). The cache memory 23 temporarily stores data to be transferred and written into the disk drive 22.

The RAID controller 24 transfers data for the write command to be written into the disk drive 22. For example, when the write command is received from the host server 4, the RAID controller 24 writes data for the received write command in the cache memory 23. Also, the RAID controller 24 acquires a charge capacity of a battery provided in the BBU 1 from the monitoring equipment 25 and determines whether the acquired charge capacity of the battery amounts to a capacity required for transferring data on the cache memory 23 to be written into the disk drive.

Also, when the acquired charge capacity of the battery amounts to the capacity required for transferring data to be written into the disk drive, the RAID controller 24 informs the host server 4 of the completion of the write command at the time when the data has arrived at the cache memory 23. Also, the RAID controller 24 transfers the data on the cache memory 23 to be written into the disk drive 22 after informing the completion of the write command. That is, the RAID controller 24 processes the received data at the write back mode.

Otherwise, when the acquired charge capacity of the battery does not amount to the capacity required for transferring data on the cache memory 23 to be written into the disk drive, the RAID controller 24 transfers the data from the cache memory 23 to be written into the disk drive 22. Also, the RAID controller 24 informs the host server 4 of the completion of the write command after transferring the data to be written into the disk drive 22. That is, the RAID controller 24 processes the received data at the write through mode.

The monitoring equipment 25 monitors the charge capacity of the battery provided in the BBU 1. Further, when the PSU 3 is disconnected (hereinafter, referred to as "when the power supply is disconnected"), the monitoring equipment 25 does not inform the battery provided in the BBU 1 of the charge capacity of the battery. This is because the monitoring equipment 25 stops during the power supply disconnection.

[Hardware Configuration of BBU]

Figure 2:
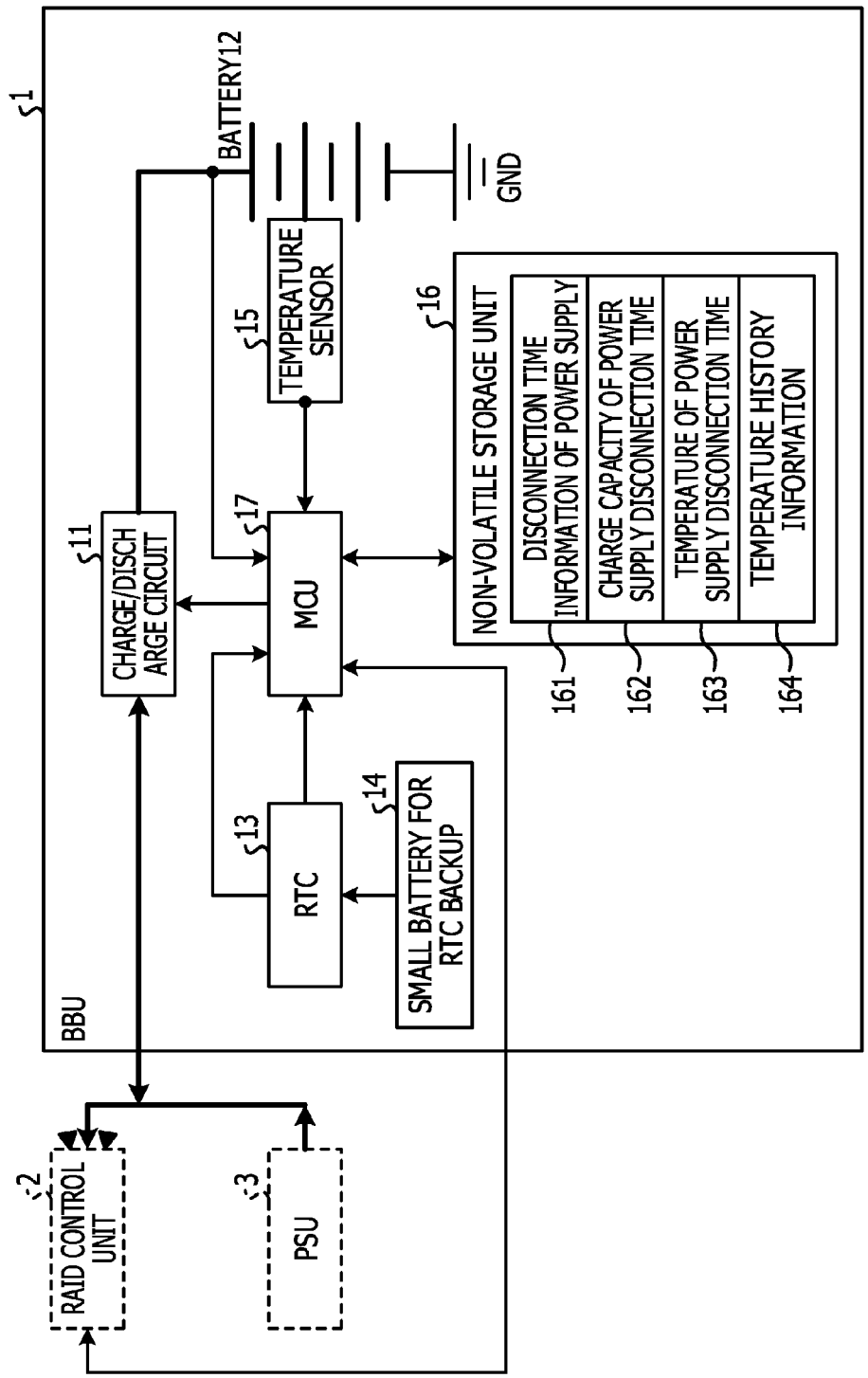
FIG. 2 is a view illustrating a hardware configuration of a BBU according to Embodiment 1.

FIG. 2 is a view illustrating hardware configuration of a BBU according to Embodiment 1. As illustrated in FIG. 2, the BBU 1 includes a charge/discharge circuit 11, a battery 12, a RTC (Real Time Clock) 13 and a small battery 14 for RTC backup. Further, the BBU 1 includes a temperature sensor 15, a non-volatile storage unit 16 and a MCU (Micro Controller Unit) 17.

When the power supply is not disconnected, the charge/discharge circuit 11 supplies the battery 12 with power from the PSU 3 through a power supplying line to charge the battery 12. Further, when the power supply is disconnected, the charge/discharge circuit 11 does not supply the battery 12 with power from the PSU 3 through the power supplying line and thus, the battery 12 is not charged.

When the power supply is not disconnected, the battery 12 is charged by the power supplied from the PSU 3 through the charge/discharge circuit 11. Further, when the power supply is disconnected, the battery 12 is not supplied with power from the PSU 3 through the charge/discharge circuit 11 and thus, the battery 12 is discharged to the ground. Further, the battery 12 informs the MCU 17 to be described below of a value of a release voltage of the battery 12 in a case of reactivation. The release voltage described above refers to a voltage of a state during which electrical current is not being flown on a line between the charge/discharge circuit 11 and the battery 12.

The RTC 13 is a chip dedicated for time counting. When the power supply is not disconnected, the RTC 13 is supplied with power from the PSU 3 to perform the time counting. When the power supply is disconnected, the RTC 13 is supplied with power from the small battery 14 for RTC backup to perform the time counting. The RTC 13 informs the MCU 17 of time information.

In a case where the RTC 13 is unable to be supplied with power from the PSU 3, for example, the small battery 14 for RTC backup supplies the RTC 13 with power when the power supply is disconnected.

The temperature sensor 15 is a sensor used for measuring the temperature of the battery 12. The temperature sensor 15 is provided on the vicinity of the battery 12. The temperature sensor 15 informs the MCU 17 of the temperature information.

The non-volatile storage unit 16 corresponds to a storage device, such as a non-volatile semiconductor memory device such as, for example, a flash memory (Flash Memory) or FRAM (registered trademark) (Ferroelectric Random Access Memory). Further, the non-volatile storage unit 16 stores disconnection time information of power supply 161, a charge capacity of power supply disconnection time 162, temperature of power supply disconnection time 163 and a temperature history information 164. The disconnection time information of power supply 161 stores the time information at the time when a power supply is disconnected. The charge capacity of power supply disconnection time 162 stores the charge capacity of the battery 12 at the time when the power supply is disconnected. The temperature of power supply disconnection time 163 stores the temperature of the battery 12 at the time when the power supply is disconnected. The temperature history information 164 stores the temperature history of the battery 12. The temperature of the battery 12 measured at a predetermined time interval is stored in the temperature history information 164. The predetermined time interval is, for example, one hour, but is not limited thereto.

The MCU 17 diagnoses the charge capacity of the battery 12 at the time when the system is reactivated.

For example, when the disconnection of the PSU 3 is detected, the MCU 17 maintains the time information acquired from the RTC 13 at the time of the detection of the power supply disconnection in the disconnection time information of power supply 161. Further, the MCU 17 maintains the charge capacity of the battery 12 at the time when the power supply is disconnected in the charge capacity of power supply disconnection time 162. Further, the MCU 17 maintains the time information notified from the temperature sensor 15 at the time of the detection of the power supply disconnection in the temperature of power supply disconnection time 163. Further, the MCU 17 maintains the time information notified from the temperature sensor 15 in the temperature history information 164 at a predetermined time interval.

Further, when the reactivation of PSU 3 is detected, the MCU 17 calculates the charge capacity of the battery 12 from the value of the release voltage of the battery 12 at the time of the detection of the reactivation. In this case, the MCU 17 calculates the charge capacity for a case where the strictest condition is applied to the release voltage of the battery 12. This is because the RAID device 9 intends to avoid the data loss from occurring due to the failure of data backup at the time of the power failure after the reactivation. Also, the MCU 17 maintains the calculated charge capacity of the battery 12 at the time of the reactivation in the non-volatile storage unit 16 as a first candidate. Further, description is made on a case where the MCU 17 calculates the charge capacity of the battery 12 at the time when the reactivation of the PSU 3 is detected, but is not limited thereto. The MCU 17 may be adapted to calculate the charge capacity of the battery 12 according to an instruction from the monitoring equipment.

Further, the MCU 17 calculates a power supply disconnected time period from the time information acquired from the RTC 13 at the time when the disconnection of the PSU 13 is detected and the disconnection time information of power supply 161. Also, when the calculated power supply disconnected time period is shorter than a predetermined time period, the MCU 17 sets the charge capacity of power supply disconnection time 162 as the charge capacity at the time of the reactivation. The predetermined time period indicates a time period which makes it possible to determine that self-discharge has not occurred in the battery 12. As for an example, a first time period is one (1) hour, but the time period is not limited thereto.

Further, when the calculated power supply disconnected time period is longer than the predetermined time period, the MCU 17 calculates the charge capacity of the battery 12 estimated from the temperature of the battery 12 in a state during which the power supply is disconnected according to the corresponding power supply disconnected time period. As an example, the MCU 17 calculates the temperature in the state during which the power supply is disconnected. The temperature in the state during which the power supply is disconnected is estimated from, for example, the temperature history information 164. Also, the MCU 17 calculates the charge capacity at the time when the battery 12 is being neglected for a power supply disconnected time period at a temperature in the state during which the power supply is disconnected using, for example, a self-discharge characteristic curve with respect to temperature of the battery 12. Also, the MCU 17 maintains the calculated charge capacity of the battery 12 at the time of the reactivation in the non-volatile storage unit 16 as a second candidate.

Further, when the charge capacity maintained as the second candidate is greater than the charge capacity maintained as the first candidate, the MCU 17 sets the charge capacity maintained as the second candidate as the charge capacity at the time of the reactivation. That is, the MCU 17 adopts the charge capacity, which is maintained as the second candidate and for which the temperature of the battery 12 is taken into account, as the charge capacity at the time of the reactivation. Further, when the charge capacity maintained as the second candidate is greater than or equal to the charge capacity maintained as the first candidate, the MCU 17 sets the charge capacity maintained as the first candidate as the charge capacity at the time of the reactivation. That is, the MCU 17 adopts the charge capacity, for a case where the strictest condition is applied to the value of the release voltage of the battery 12, as the charge capacity at the time of the reactivation.

Further, when the calculated power supply disconnected time period is long enough so that the charge capacity of the battery 12 does not depend on the temperature or it is unable to calculate the power supply disconnected time period, the MCU 17 sets the charge capacity maintained as first candidate as the charge capacity at the time of the reactivation. That is, in such a case, the MCU 17 adopts the charge capacity for a case where the strictest condition is applied to the value of the release voltage of the battery 12 as the charge capacity at the time of the reactivation without applying estimation of the self-discharge caused by the disconnection of the power supply.

Further, the MCU 17 corrects the calculated charge capacity at the time of the reactivation based on a value of internal resistance of the battery 12. For example, the MCU 17 calculates a difference between discharge capacities before and after degradation of performance of the battery until the battery is degraded to a lifetime state of impending exhaustion of the charge capacity from the value of internal resistance of the battery 12 measured at previous charge. Also, the MCU 17 corrects the adopted charge capacity at the time of the reactivation using the calculated difference between the discharge capacities.

Figure 3:
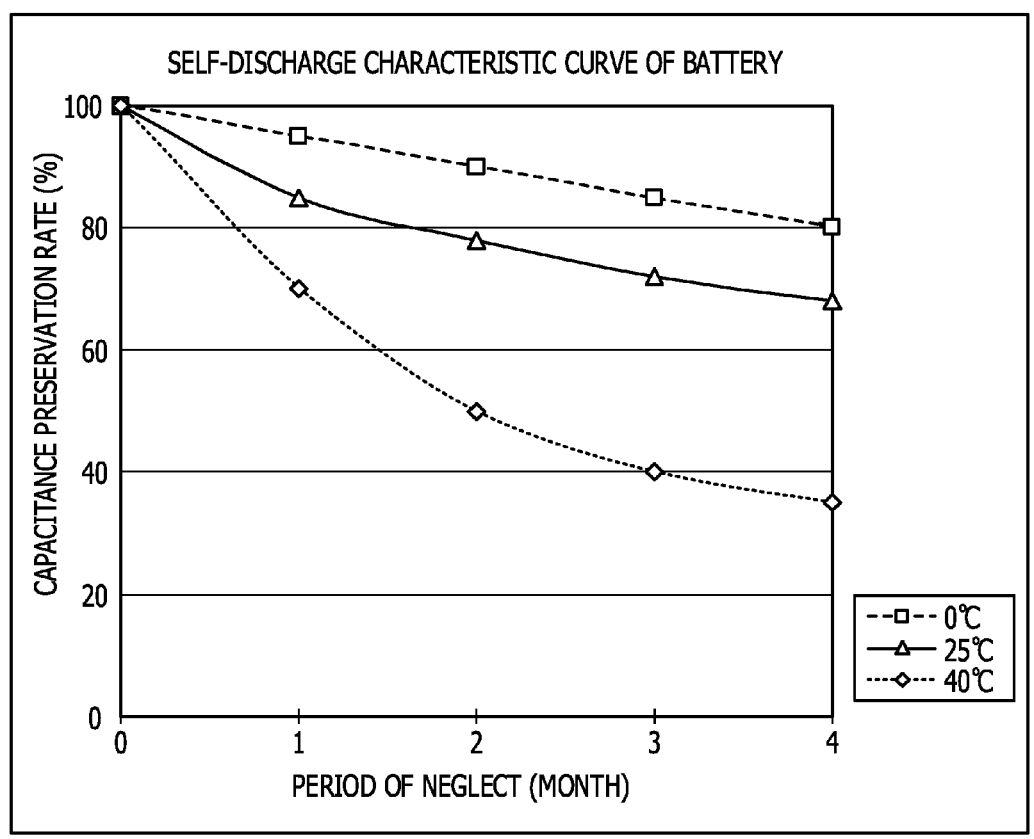
FIG. 3 is a diagram illustrating an example of a self-discharge characteristic curve of a battery.

Here, an example of a self-discharge characteristic curve with respect to the temperature of the battery 12 will be described with reference to FIG. 3. FIG. 3 is a diagram illustrating an example of a self-discharge characteristic curve of battery. As illustrated in FIG. 3, the X-axis indicates a period of neglect (month) and the Y-axis indicates a capacitance preservation rate (%) of the charge capacity. The self-discharge characteristic curve of battery is a curve which depends on the temperature of the battery 12 and indicates the capacitance preservation rate with respect to the period of neglect. In the example of FIG. 3, the capacitance preservation rate with respect to the period of neglect becomes lower as the temperature of the battery 12 increases. The MCU 17 calculates the capacitance preservation rate corresponding to the power supply disconnected time period at the temperature of the battery 12 using the self-discharge characteristic curve of battery. For example, the MCU 17 calculates the capacitance preservation rate corresponding to the charge capacity of power supply disconnection time 162. Also, the MCU 17 obtains the period of neglect corresponding to the calculated capacitance preservation rate using the self-discharge characteristic curve of battery. Also, the MCU 17 obtains the capacitance preservation rate for a case where the power supply disconnected time period has exceeded from the period of neglect obtained using the self-discharge characteristic curve of battery. Also, the MCU 17 may obtain the charge capacity corresponding to the obtained capacitance preservation rate.

[Flowchart of Charge Capacity Diagnosis Process]

Figure 4:
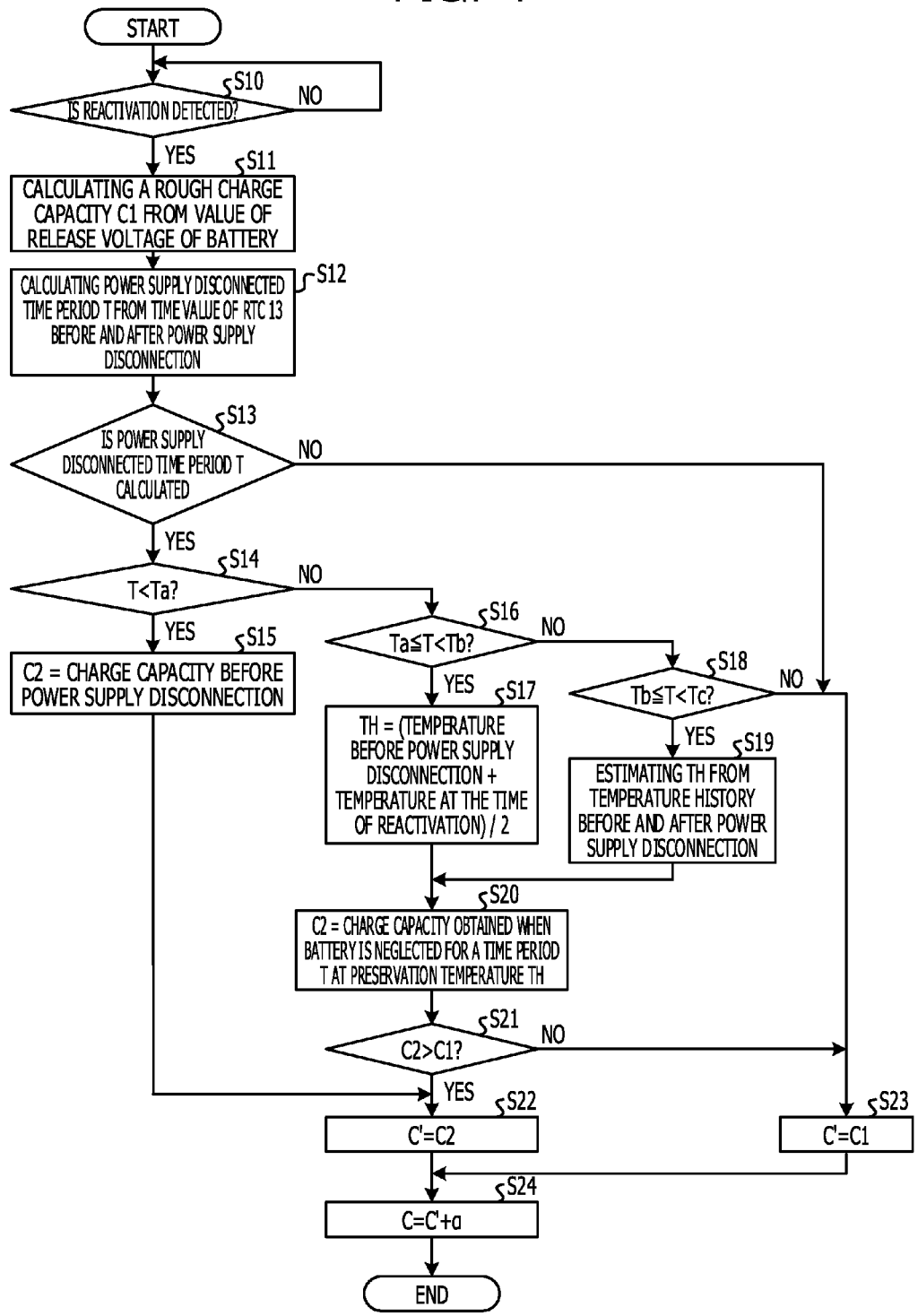
FIG. 4 is a flowchart illustrating a charge capacity diagnosis process at the time of reactivation.

Next, a flowchart of a charge capacity diagnosis process at the time of the reactivation of the BBU 1 will be described with reference to FIG. 4. FIG. 4 is a flowchart illustrating a charge capacity diagnosis process at the time of the reactivation. Further, it is assumed that the value of internal resistance of the battery 12 measured at the time of the previous charge is stored in the non-volatile storage unit 16.

The MCU 17 of the BBU 1 determines whether the reactivation of the PSU 3 is detected (step S10). When it is determined that the reactivation of the PSU 3 is not detected ("NO" at step S10), the MCU 17 repeats the determination processing.

In the meantime, when it is determined that the reactivation of the PSU 3 is detected ("YES" at step S10), the MCU 17 calculates the charge capacity (C1) from the value of the release voltage of the battery 12 at the time of the detection (step S11). For example, the MCU 17 detects the release voltage of the battery 12 at the time of the detection and calculates a rough charge capacity determined based on the detected release voltage and the charge capacity maintained in the charge capacity of power supply disconnection time 162. That is, the MCU 17 calculates the charge capacity for a case where the strictest condition is applied to the value of the release voltage of the battery 12. Further, the charge capacity C1 corresponds to the first candidate described above.

Also, the MCU 17 calculates the power supply disconnected time period T from the time information of the RTC 13 before and after the power supply is disconnected (step S12). For example, the MCU 17 acquires the time information at the time of the detection of reactivation from the RTC 13 and calculates the power supply disconnected time period from the acquired time information and the time information maintained in the disconnection time information of power supply 161.

Subsequently, the MCU 17 determines whether the power supply disconnected time period T is calculated (step S13). When it is determined that the power supply disconnected time period T is not calculated ("NO" at step S13), the MCU 17 proceeds to step S23 in order to apply the rough charge capacity.

In the meantime, when it is determined that the power supply disconnected time period T is calculated ("YES" at step S13), the MCU 17 determines whether the power supply disconnected time period T is shorter than a first time period Ta (step S14). The first time period Ta refers to a time period which makes it possible to determine that self-discharge has not occurred in the battery 12. When it is determined that the power supply disconnected time period T is shorter than a first time period Ta ("YES" at step S14), the MCU 17 determines that the self-discharge has not occurred in the battery 12 and sets the charge capacity before the power supply is disconnected, which is maintained in the charge capacity of power supply disconnection time 162, as the charge capacity C2 (step S15). Also, the MCU 17 proceeds to step S22.

When it is determined that the power supply disconnected time period T is not shorter than the first time period Ta ("NO" at step S14), the MCU 17 determines whether the power supply disconnected time period T is greater than or equal to the first time period Ta and less than a second time period Tb (step S16). The second time period Tb refers to a time period which makes it possible to determine the temperature of the battery 12 in a state during which the power supply is disconnected as the average temperature of the temperature of power supply disconnection time and the temperature at the time of the reactivation. When it is determined that the power supply disconnected time period T is greater than or equal to the first time period Ta and less than the second time period Tb ("YES" at step S16), the MCU 17 sets the average temperature of the temperature before the power supply is disconnected, which is maintained in the temperature of power supply disconnection time 163, and the temperature at the time of the reactivation as a temperature TH in a state during which the power supply is disconnected, in regard to the battery 12 (step S17). Also, the MCU 17 proceeds to step S20 so as to calculate the charge capacity.

In the meantime, when it is determined that the power supply disconnected time period T is greater than the second time period Tb ("NO" at step S16), the MCU 17 determines whether the power supply disconnected time period is greater than or equal to the second time period Tb and less than a third time period Tc (step S18). The third time period Tc refers to a time period which makes it possible to estimate the temperature of the battery 12 in a state during which the power supply is disconnected from a history of temperature before and after the power supply is disconnected. When it is determined that the power supply disconnected time period T is greater than or equal to the third time period Tc ("NO" at step S18), the MCU 17 proceeds to step S23 in order to apply the rough charge capacity.

In the meantime, when it is determined that the power supply disconnected time period T is greater than or equal to the second time period Tb and less than the third time period Tc ("YES" at step S18), the MCU 17 performs the following processings. That is, the MCU 17 estimates the temperature TH in a state during which the power supply is disconnected from the temperature information before and after the power supply is disconnected, which is maintained in the temperature history information 164, in regard to the battery 12 (step S19). For example, the MCU 17 sets the average temperature of the temperature maintained for a predetermined time period before the power supply is disconnected and the temperature at the time of the reactivation as the temperature TH in a state during which the power supply is disconnected, using the temperature history stored in the temperature history information 164. Also, MCU 17 proceeds to step S20 in order to calculate the charge capacity.

At step S20, the MCU 17 calculates the charge capacity C2 obtained when the battery 12 is neglected for the power supply disconnected time period T at the temperature TH in a state during which the power supply is disconnected (step S20). For example, the MCU 17 calculates the charge capacity C2 of the battery 12 when the battery 12 is neglected for the power supply disconnected time period T using the self-discharge characteristic curve corresponding to the temperature TH in the state during which the power supply is disconnected.

Also, the MCU 17 determines whether the charge capacity C2 is greater than the charge capacity C1 (step S21). That is, the MCU 17 determines whether the charge capacity C2 is greater than the charge capacity C1, which has a rough value and is calculated from the value of the release voltage, using the charge capacity before the power supply is disconnected which is maintained in the charge capacity of power supply disconnection time 162. When it is determined that the charge capacity C2 is greater than the charge capacity C1 ("YES" at step S21), the MCU 17 proceeds to step S22.

At step S22, the MCU 17 sets the charge capacity C2 obtained at step S15 or step S20 as the charge capacity C' of the battery 12 at the time of the reactivation (step S22). Also, the MCU 17 proceeds to step S24 in order to correct the charge capacity of the battery 12.

At step S23, the MCU 17 sets the charge capacity C1 obtained at step S11 as the charge capacity C' of the battery 12 at the time of the reactivation (step S23). The MCU 17 proceeds to step S24 in order to correct the charge capacity of the battery 12.

At step S24, the MCU 17 corrects the charge capacity C' of the battery 12 based on the deterioration degree of the battery 12 (step S24). For example, the MCU 17 calculates the difference between the discharge capacities before and after degradation of performance of the battery until the battery is degraded to a lifetime state of impending exhaustion of the charge capacity from the value of internal resistance of the battery 12 stored in the non-volatile storage unit 16. Also, the MCU 17 corrects the charge capacity C' at the time of the reactivation to a charge capacity C (=C'+α) using the calculated difference of the discharge capacity. The term of "α" is a correction amount by the deterioration degree of the battery. Also, the MCU 17 ends the charge capacity diagnosis process at the time of the reactivation.

Thereafter, the MCU 17 accumulates the charge capacity which amount to a charge capacity for a charge time based on the calculated charge capacity C at the time of the reactivation to assess the charge capacity corresponding to the charge time. As a result, the RAID controller 24 acquires the charge capacity of the battery 12 from the monitoring equipment 25 in the RAID control unit 9 to which the charge capacity of the battery 12 is notified from the MCU 17. Also, the RAID controller 24 determines whether the acquired charge capacity of the battery 12 amounts to a capacity required for transferring data on the cache memory 23 to be written into the disk drive. Also, when it is determined that the acquired charge capacity of the battery amounts to the capacity required for transferring data on the cache memory 23 to be written into the disk drive, the RAID controller informs the host server 4 of completion of the write command at the time when the data has arrived at the cache memory 23. That is, the RAID controller 24 processes the received data at the write back mode. In the meantime, when it is determined that the acquired charge capacity of the battery does not amount to the capacity required for transferring data on the cache memory 23 to be written into the disk drive, the RAID controller 24 informs the host server 4 of completion of the write command after transferring the data to be written into the disk drive 22. That is, the RAID controller 24 processes the received data at the write through mode.

[Effect of Embodiment 1]

According to Embodiment 1, the BBU 1 stores a power disconnection time which indicates a time at which the power supply is disconnected. Also, when the power supply is reactivated, the BBU 1 diagnoses the charge capacity of the battery 12 at the time of the reactivation based on the stored power disconnection time, a power supply disconnected time period obtained from the time at which the power supply is reactivated, the temperature of the battery 12 in a state during which the power supply is disconnected and the deterioration degree of the battery 12. According to this configuration, since the BBU 1 diagnoses the charge capacity of the battery 12 at the time of the reactivation by taking into account the temperature of the battery 12 in the state during which the power supply is disconnected and the deterioration degree of the battery 12, the accuracy of diagnosis may be enhanced.

Further, according to Embodiment 1, when the power supply is reactivated, the BBU 1 calculates the charge capacity of the battery 12 at the time of the reactivation based on the stored power disconnection time, a power supply disconnected time period obtained from the time at which the power supply is reactivated and the temperature of the battery 12 in a state during which the power supply is disconnected. Also, the BBU 1 corrects the calculated charge capacity of the battery 12 based on the value of internal resistance of the battery 12. According to this configuration, the BBU 1 may correct the charge capacity based on the value of internal resistance of the battery 12 used for diagnosing the battery life so as to calculate the charge capacity for which degradation of life of the battery is additionally taken into account. As a result, the BBU 1 may improve the diagnosis accuracy of the charge capacity of the battery 12.

Further, according to Embodiment 1, the BBU 1 calculates the charge capacity of the battery 12 at the time of the reactivation based on the power supply disconnected time period and the temperature of the battery 12 in a state during which the power supply is disconnected. Also, the BBU 1 measures a resistance value of the battery 12 and corrects the calculated charge capacity of the battery 12 based on the measured resistance value. According to this configuration, the BBU 1 may correct the charge capacity based on the value of internal resistance of the battery 12 used for diagnosing the battery life so as to calculate the charge capacity for which degradation of life of the battery is additionally taken into account. As a result, the BBU 1 may improve the diagnosis accuracy of the charge capacity of the battery 12.

Further, according to Embodiment 1, the BBU 1 also stores the temperature of battery at a predetermined time interval as a history of the temperature. Also, the BBU 1 estimates the temperature of the battery 12 in a state during which the power supply is disconnected from the stored history of temperature and calculates the charge capacity of the battery 12 at the time of the reactivation based on the power supply disconnected time period and the estimated temperature. According to this configuration, the BBU 1 may use the temperature of the battery 12 estimated from the history of the temperature and the power supply disconnected time period in calculation of the charge capacity of the battery 12 at the time of the reactivation so as to accurately estimate the charge capacity of the battery 12 which is changed according to the temperature and the power supply disconnected time period.

Further, according to Embodiment 1, the BBU 1 calculates the charge capacity of the battery 12 estimated from the self-discharge characteristic of the battery 12 corresponding to the temperature of the battery 12 in a state during which the power supply is disconnected according to the power supply disconnected time period. According to the configuration described above, the BBU 1 may use the self-discharge characteristic of the battery 12 corresponding to the temperature of the battery 12 in calculation of the charge capacity of the battery 12 so as to accurately estimate the charge capacity of the battery 12.

Embodiment 2

In Embodiment 1, descriptions have been made on a case where the BBU 1 of the RAID device 9 includes the RTC 13 and the small battery 14 for RTC backup. However, the RAID device 9 is not limited thereto and the RAID control unit 2 of the RAID device 9 may include the RTC 13 and the small battery 14 for RTC backup.

Accordingly, in Embodiment 2, a case where the RAID control unit 2 includes the RTC 13 and the small battery 14 for RTC backup will be described.

[Hardware Configuration of RAID Device According to Embodiment 2]

Figure 5:
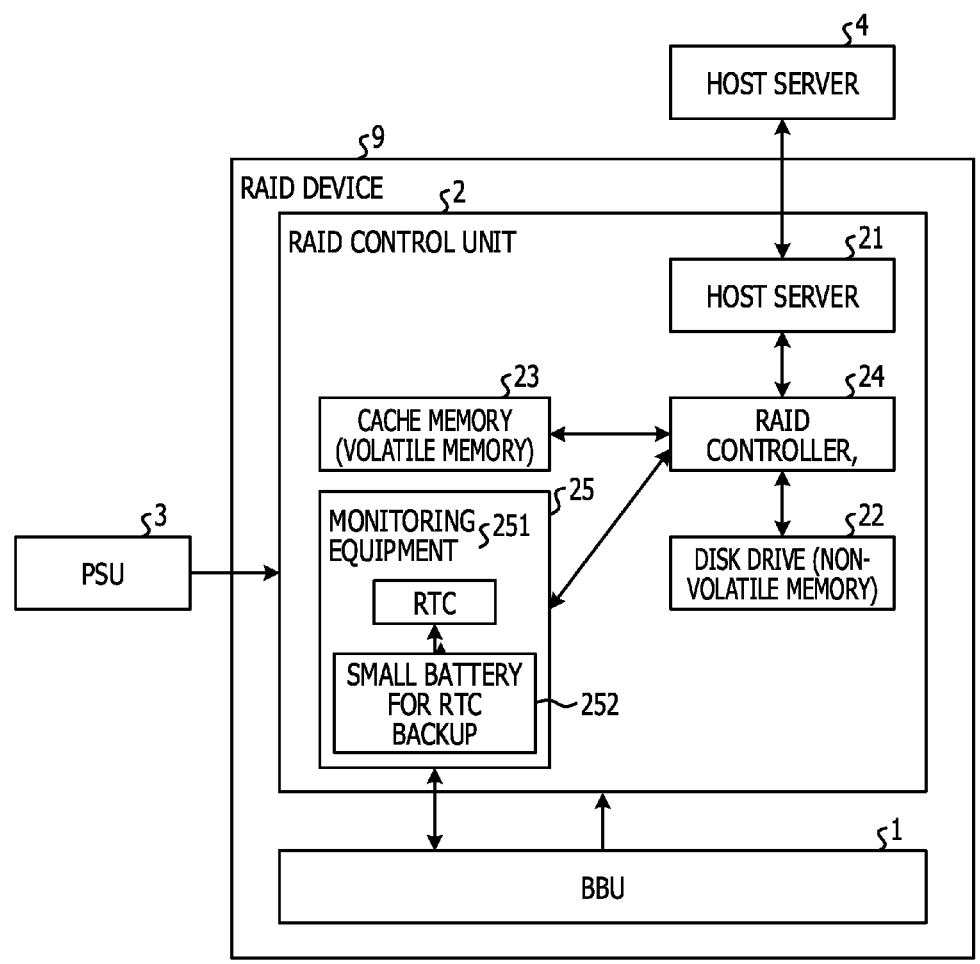
FIG. 5 is a view illustrating the hardware configuration of the RAID device according to Embodiment 2.

FIG. 5 is a view illustrating a hardware configuration of a RAID device according to Embodiment 2. Further, the components of FIG. 5 which are the same as those of the RAID device 9 illustrated in FIG. 1 will be denoted by the same reference numerals and descriptions for the redundant configuration and operations thereof will be omitted. Embodiment 2 is different from Embodiment 1 in that the RTC 251 and a small battery 252 for RTC backup are added in the monitoring equipment 25 of the RAID control unit 2.

[Hardware Configuration of BBU According to Embodiment 2]

Figure 6:
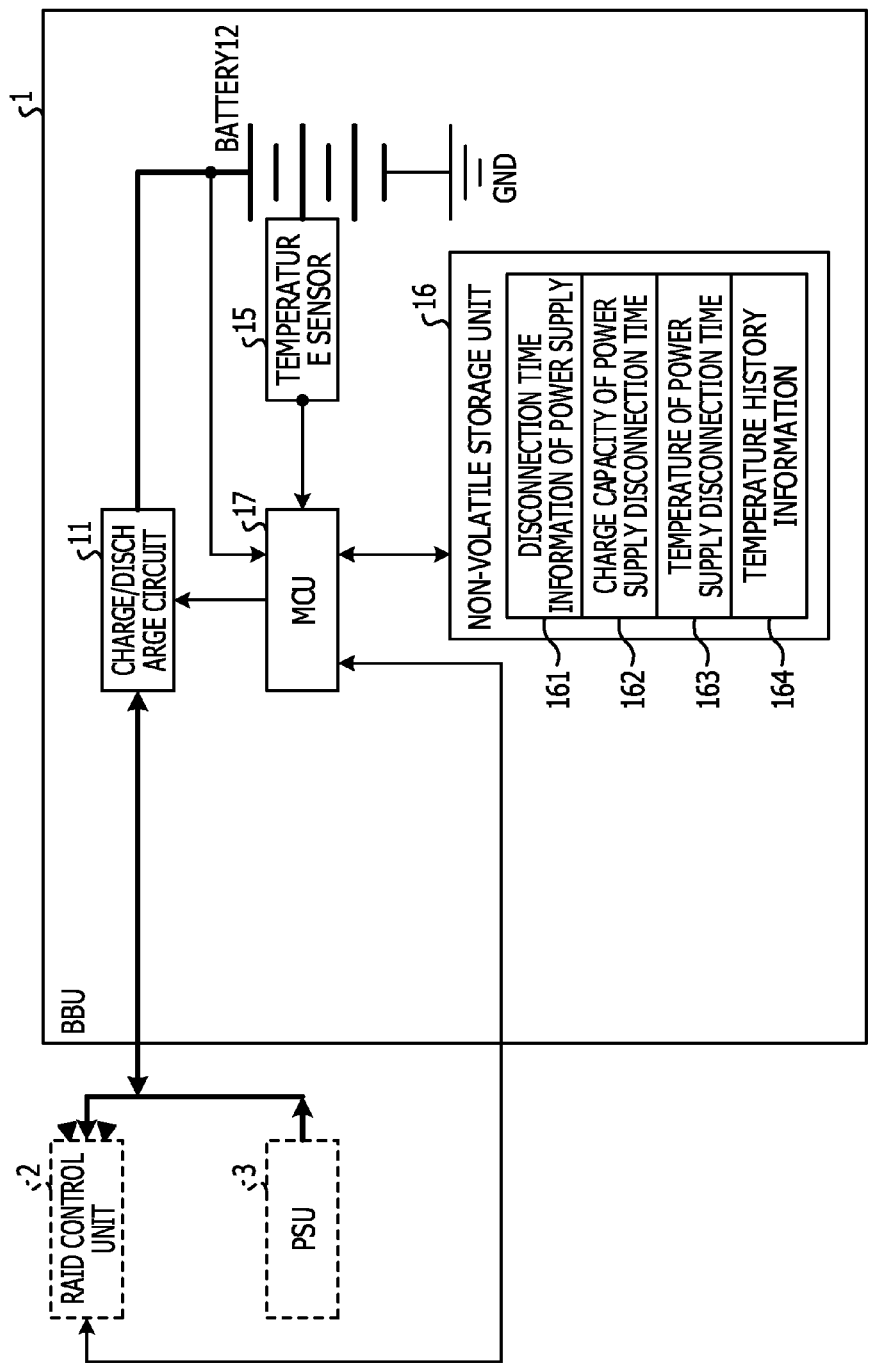
FIG. 6 is a view illustrating the hardware configuration of the BBU according to Embodiment 2.
Figure 7:
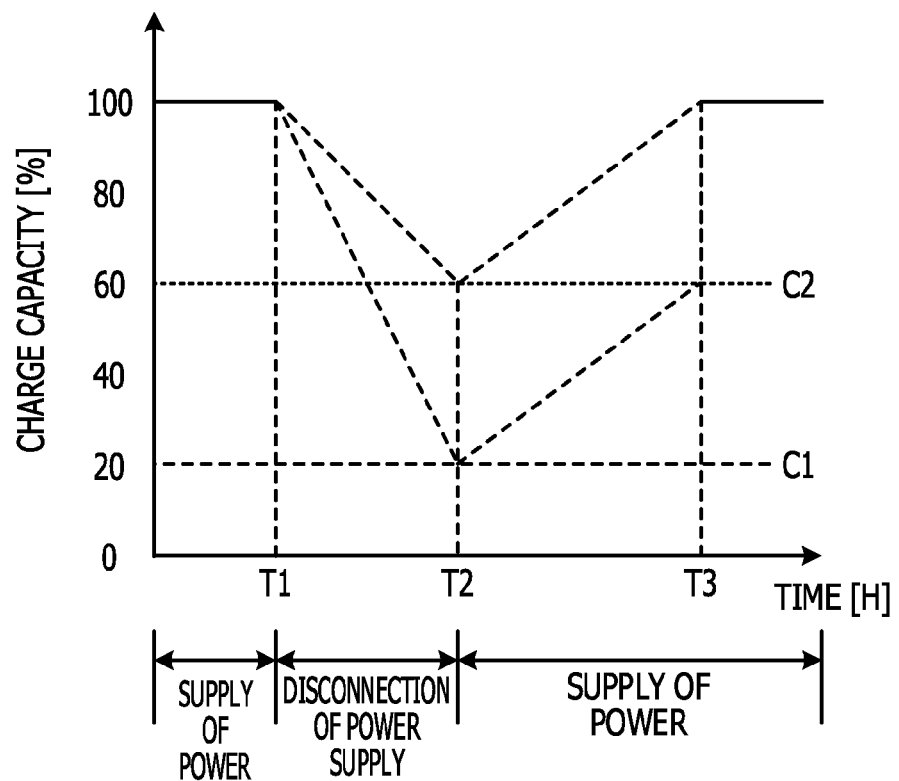
FIG. 7 is a view explaining about a charge capacity at the time of the reactivation.

FIG. 6 is a view illustrating a hardware configuration of the BBU according to Embodiment 2. Further, the components of the BBU which are the same as those of the BBU 1 illustrated in FIG. 2 will be denoted by the same reference numerals and descriptions for the redundant configuration and operations thereof will be omitted. Embodiment 2 is different from Embodiment 1 in that the RTC 13 and the small battery 14 for RTC backup are removed from the BBU 1.

The MCU 17 acquires time information from the RTC 251 provided in the monitoring equipment 25 of the RAID control unit 2. For example, when the disconnection of the PSU 3 is detected, the MCU 17 maintains the time information acquired from the RTC 251 at the time when the disconnection of the power supply is detected in the disconnection time information of power supply 161. Further, when the reactivation of the PSU 3 is detected, the MCU 17 calculates the power supply disconnected time period from time information acquired from the RTC 251 and the disconnection time information of power supply 161.

Also, the MCU 17 calculates the charge capacity of the battery 12 at the time of the reactivation based on the calculated power supply disconnected time period and the temperature of the battery 12 in a state during which the power supply is disconnected. Further, the MCU 17 measures the resistance value of battery 12 and corrects the calculated charge capacity of the battery 12 based on the measured resistance value.

[Effect of Embodiment 2]

According to Embodiment 2, the RTC 251 and the small battery 252 for RTC backup are adapted to be installed outside of the BBU 1 instead of being installed inside of the BBU 1. The BBU 1 stores the power disconnection time which indicates the time at which the power supply is disconnected acquired from the RTC 251. Also, the BBU 1 performs the following processings when the power supply is reactivated. That is, the BBU 1 diagnoses the charge capacity of the battery 12 at the time of the reactivation based on the stored power disconnection time, a power supply disconnected time period obtained from the time at the time of the reactivation acquired from the RTC 251, the temperature of the battery 12 in a state during which the power supply is disconnected and the degradation degree of the battery 12. According to the configuration described above, even when the RTC 251 and the small battery 252 for RTC backup are adapted to be provided outside of the BBU 1, the BBU 1 may diagnose the charge capacity of the battery 12 at the time of the reactivation by taking into account the temperature of the battery 12 in a state during which the power supply is disconnected and the degradation degree of the battery 12. Accordingly, the BBU 1 may improve the diagnosis accuracy.

[Others]

Further, descriptions have been made on a case where the BBU 1 illustrated is equipped in the RAID device 9. However, the BBU 1 is not limited thereto and may be connected with the RAID device 9 as an external device of the RAID device 9. Furthermore, the BBU 1 may be equipped in a separate device, in which its own device may be equipped as a device other than the RAID device 9, or may be adapted to be connected with the separate device.

Further, each component of the RAID device 9 illustrated does not necessarily need to be configured in accordance with a physical configuration as illustrated. That is, a specific shape of distribution or integration of the RAID device 9 is not limited to a shape as illustrated above. That is, some or all of components of the RAID device 9 may be configured by being functionally and physically distributed or integrated in any basic functional unit depending on, for example, various load or use situations. For example, the RTC 13 and the small battery 14 for RTC backup may be integrated into a single unit. The processings performed by the MCU 17 may be distributed to a processing unit which performs a processing for a case where the disconnection of the power supply is detected and a processing unit which performs a processing for a case where the reactivation of the power supply is detected.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A storage device comprising:
    battery backup circuitry that includes
        a battery,
        a non-volatile storage that stores a first time when a power supply to the storage device is cut, and
        battery control circuitry that calculates a power supply disconnected time period of the storage device from the first time acquired from the non-volatile storage and a second time when the power supply to the storage device is activated, wherein
            when the calculated power supply disconnected time period is shorter than a predetermined time period, the battery control circuitry determines that self-discharge has not occurred in the battery, and
            when the calculated power supply disconnected time period is longer than the predetermined time period, the battery control circuitry determines that self-discharge has occurred in the battery and calculates a charge capacity of the battery at the time when the battery is being neglected for a power supply disconnected time period at a temperature in the state during which the power supply is disconnected using a self-discharge characteristic curve with respect to temperature of the battery; and
    RAID control circuitry that includes
        a cache memory that is a volatile memory,
        a disk drive that is a non-volatile memory, and
        a controller that receives a write command from a host server and stores data from the host server in the cache memory,
    wherein the controller, based on the charge capacity of the battery, issues a completion of the write command to the host server at a time when the controller stores the data in the cache memory, or the controller issues the completion of the write command to the host server after the controller transfers the data of the cache memory to the disk drive.

2. The storage device according to claim 1, wherein when the charge capacity of the battery amounts to a capacity required for transferring data on the cache memory to be written into the disk drive, the controller issues the completion of the write command at the time when the controller stores the data in the cache memory.

3. The storage device according to claim 1, wherein when the charge capacity of the battery does not amount to a capacity required for transferring data on the cache memory to be written into the disk drive, the controller issues the completion of the write command after the controller transfers the data of the cache memory to the disk drive.

4. The storage device according to claim 1, wherein the battery control circuitry calculates the charge capacity of the battery based on the power supply disconnected time period and a temperature of the battery in a state during which the power supply is cut.

* * * * *